United States Patent
Yoh

(10) Patent No.: US 6,468,922 B2
(45) Date of Patent: Oct. 22, 2002

(54) METHOD FOR MANUFACTURING A SEMICONDUCTOR DEVICE WITH A DUAL INTERLAYER INSULATOR FILM OF BOROPHOSPHOSILICATE GLASS TO PREVENT DIFFUSION OF PHOSPHORUS

(75) Inventor: Syoji Yoh, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/938,538

(22) Filed: Aug. 27, 2001

(65) Prior Publication Data

US 2002/0037638 A1 Mar. 28, 2002

Related U.S. Application Data

(62) Division of application No. 09/313,196, filed on May 18, 1999, now Pat. No. 6,300,681.

(30) Foreign Application Priority Data

May 20, 1998 (JP) ............................................. 10-155220

(51) Int. Cl.[7] ............................................. H01L 21/441
(52) U.S. Cl. ........................ 438/760; 438/761; 438/778
(58) Field of Search ................................. 438/760, 761, 438/778, 787

(56) References Cited

U.S. PATENT DOCUMENTS

| 5,268,333 A | * | 12/1993 | Lee et al. ............... 438/698 |
| 5,354,387 A | * | 10/1994 | Lee et al. ............... 148/33.3 |
| 5,598,028 A | * | 1/1997 | Losavio et al. ............ 257/644 |
| 5,656,556 A | | 8/1997 | Yang ..................... 438/646 |
| 6,319,848 B1 | * | 11/2001 | Litwin et al. .............. 438/761 |

* cited by examiner

Primary Examiner—Richard Elms
Assistant Examiner—Beth E. Owens
(74) Attorney, Agent, or Firm—Volentine Francos, PLLC

(57) ABSTRACT

A method of forming a semiconductor device includes providing a semiconductor substrate with an active region, covering the active region of the semiconductor substrate with an oxide film, covering the oxide film with a first borophosphosilicate glass film, and covering the first borophosphosilicate glass film with a second borophosphosilicate glass film. The first borophosphosilicate glass film has a boron oxide concentration which is lower than that of the second borophosphosilicate glass film, and is thus a phosphorus diffusion preventing film.

8 Claims, 2 Drawing Sheets

METHOD FOR MANUFACTURING A SEMICONDUCTOR DEVICE WITH A DUAL INTERLAYER INSULATOR FILM OF BOROPHOSPHOSILICATE GLASS TO PREVENT DIFFUSION OF PHOSPHORUS

This is a divisional application of application Ser. No. 09/313,196, filed May 18, 1999, now U.S. Pat. No. 6,300,681 issued on Oct. 9, 2001, which is hereby incorporated by reference in its entirety for all purposes.

BACKGROUND OF THE INVENTION

1. Field of the Invention

The present invention generally relates to a semiconductor device and a method for forming the same, and more particularly, the present invention relates to the semiconductor device and the method for forming the same, having a borophosphosilicate glass film as an interlayer insulator.

This application is a counterpart of Japanese application Ser. No. 155220/1998, filed May 20, 1998, the subject matter of which is incorporated herein by reference.

2. Description of the Related Art

In general, a multi-level interconnection is used effectively to provide the advantage of high integration. In the multi-level interconnection, an interlayer insulator is formed between interconnections. A borophosphosilicate glass film as the interlayer insulator is used for planarization in VLSI circuit.

The borophosphosilicate glass film covers an active region of a semiconductor device such as a MOS transistor. Then, the borophosphosilicate glass film is reflowed using thermal treatment. As a result, the interlayer insulator having a smooth surface is formed.

However, phosphorus in the borophosphosilicate glass film is diffused to the active region of the semiconductor device during reflow. It is desirable to avoid the outdiffusion of the phosphorus to the active region of the semiconductor device.

SUMMARY OF THE INVENTION

An object of the present invention is to provide a semiconductor device that can give an outdiffusion preventing function to an underlayer for phosphorus, of plural interlayer insulators including boron.

According to one aspect of the present invention, for achieving the above object, there is provided a semiconductor device comprising: a semiconductor substrate with an active region; an oxide film to cover the active region of the semiconductor substrate; a first borophosphosilicate glass film to cover the oxide film; and a second borophosphosilicate glass film to cover the first borophosphosilicate glass film; wherein the first borophosphosilicate glass film has a concentration of boron oxide which is lower than that of the second borophosphosilicate glass film.

An object of the present invention is to provide a method for forming a semiconductor device that can avoid the outdiffusion of the phosphorus to the active region of the semiconductor device.

According to another aspect of the present invention, for achieving the above object, there is provided a method for forming a semiconductor device comprising:

providing a semiconductor substrate with an active region; covering the active region of the semiconductor substrate with an oxide film; covering the oxide film with a first borophosphosilicate glass film having an inhibitory of an outdiffusion of the phosphorus; covering the first borophosphosilicate glass film with a second borophosphosilicate glass film including phosphorus and boron; and reflowing the second borophosphosilicate glass film so as to have a fluidity with thermal treatment.

BRIEF DESCRIPTION OF THE DRAWINGS

While the specification concludes with claims particularly pointing out and distinctly claiming the subject matter that is regarded as the invention, the invention, along with the objects, features, and advantages thereof, will be better understood from the following description taken in connection with the accompanying drawings, in which:

DETAILED DESCRIPTION OF THE PREFERRED EMBODIMENTS

A semiconductor device according to first and second preferred embodiments of the present invention will hereinafter be described in detail with reference to the accompanying drawings.

FIG. 1A–FIG. 1D are sectional views showing a method for forming a semiconductor device according to a first preferred embodiment of a present invention. Here, for example, the semiconductor device is a DRAM (Dynamic Random Access Memory) having COB (Capacitor On Bit line) structure.

Figure 1A:
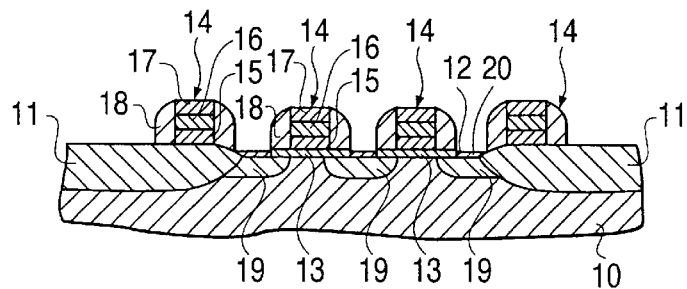
FIG. 1A–FIG. 1D are sectional views showing a method for forming a semiconductor device according to a first preferred embodiment of a present invention.

As shown in FIG. 1A, a field oxide film 11, preferably to a thickness of about 400 nm, is formed on a surface of a semiconductor substrate 10 such as silicon, using the LOCOS (LOCal Oxidiation of Silicon) method. The field oxide film 11 serves as an isolation structure between transistors. By forming the field oxide film 11 on the surface of the semiconductor substrate 10, an active region is defined on the surface of the semiconductor substrate 10. A gate oxide film 13, preferably to a thickness of 50–150 Å, is formed on the active region of a semiconductor substrate 10. A gate 14, preferably to a thickness 2000–4000 Å, is made up of a polysilicon layer 15 and a tungsten silicide layer 16. An insulating layer 17, preferably to a thickness of 2000–3000 Å, is made up of an NSG (Non-doped Silicate Glass) film or a PSG (Phosphorus-doped Silicate Glass) film formed on the gate 14 using CVD techniques. A sidewall spacer 18 is made up of an NSG film or a PSG film formed on a sidewall of the gate 14. A diffused region 19 is formed on the active region between gates 14 using an ion-implantation technique. An oxide film 20, preferably to a thickness of 200–500 Å, is formed on the active region to avoid damage of the active region before the ion implantation. In a DRAM, a select transistor and a memory cell capacitor are formed on the active region 12 between gates 14.

Figure 1B:
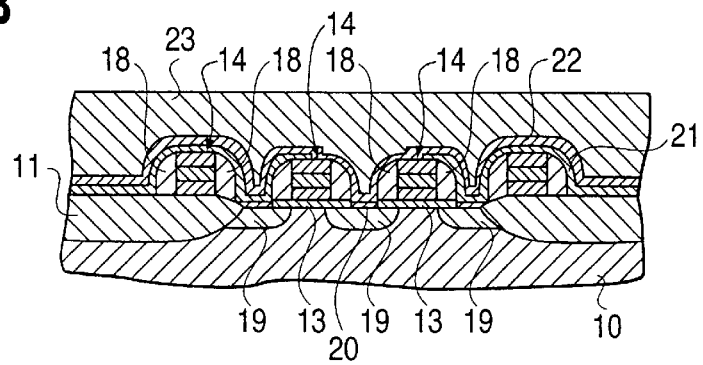

As shown in FIG. 1B, a silicon nitride film is deposited using low pressure chemical vapor deposition and then the silicon nitride film is patterned so as to cover the gate 14, the sidewall spacer 18 and the oxide film 20 on the active region. As a result, the patterned silicon nitride serves as a sacrificial film 21. The sacrificial film 21 is formed on a region which forms a bit contact. A first borophosphosilicate glass film 22, preferably to a thickness of 1000–2000 Å, is formed on the sacrificial film 21 and on remaining portions of the structure not covered by sacrificial film 21, using a CVD method. The first borophosphosilicate glass film 22 serves as a first interlayer insulator. A concentration of a boron oxide in the first borophosphosilicate glass film 22 is 10–12 weight %. A concentration of phosphorus ($P_2O_5$) in the first borophosphosilicate glass film 22 is 10–15 weight %.

A second borophosphosilicate glass film 23, preferably to a thickness of 3000–5000 Å, is formed on the first borophosphosilicate glass film 22 using a CVD method. The second borophosphosilicate glass film 23 serves as a second interlayer insulator. A concentration of a boron oxide in the second borophosphosilicate glass film 23 is 12–18 weight % which is higher than that of the first borophosphosilicate glass film 22. A concentration of phosphorus ($P_2O_5$) in the second borophosphosilicate glass film 23 is 10–15 weight % which is substantially the same as that of the first borophosphosilicate glass film 22.

After depositing the first and second, borophosphosilicate glass film 22, 23, the entire structure is annealed for reflow in an $N_2$ atmosphere at 800–950° C. As a result, a surface of the second borophosphosilicate glass film 23 becomes smooth. During this time, phosphorus in the first and second borophosphosilicate glass films 22, 23 tends to diffuse to the diffused regions 19 under the first and second borophosphosilicate glass films 22, 23 via sacrificial nitride layer 21 and the oxide film 20. However, the first preferred embodiment has the interlayer insulators of two layers which is made up of the first and second borophosphosilicate glass films 22, 23. Further, the first borophosphosilicate glass film 22 covering the oxide film 20 and the sacrificial film 21 over the active region 12, has a concentration of boron oxide which is lower than the second borophosphosilicate glass film 23. In a borophosphosilicate glass film including phosphorus and boron, it is well known that the diffusion coefficient of the phosphorus is in proportion to the concentration of the boron oxide. Therefore, the phosphorus diffusion coefficient of the first borophosphosilicate glass film 22 having a concentration of boron oxide which is lower than the concentration of boron oxide in the second borophosphosilicate glass film 23, is smaller than that of the second borophosphosilicate glass film 23. Accordingly, the first interlayer insulator 22 located between the second interlayer insulator 23 and the oxide film 20, serves as a phosphorus diffusion preventing film against the second interlayer insulator 23. By forming the first interlayer insulator 22 as the phosphorus diffusion preventing film, it can prevent diffusion from the second borophosphosilicate glass film 23 to the active region 12 via the oxide film 20. Accordingly, a contamination of the active region 12 caused by the phosphorus can be avoided.

Figure 1C:
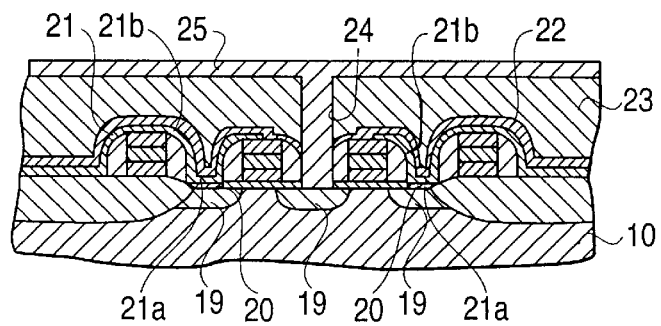

As shown in FIG. 1C, after a reflow treatment of the first and second borophosphosilicate glass films 22, 23, a contact hole 24 is formed through the first and second borophosphosilicate glass films 22, 23 and oxide film 20 to diffused region 19, at an area where the sacrificial film 21 does not exist, using well-known a photolithography and etching techniques. In etching for forming the contact hole, $C_4F_8$ gas is used. As a result, the etch rate of the borophosphosilicate glass film increases with decrease of the concentration of boron oxide.

Therefore, a phenomenon of etching stop easily appears in the first borophosphosilicate glass film 22, but the first borophosphosilicate glass film 22 has an etch rate which is larger than that of the second borophosphosilicate glass film 23. Accordingly, the contact hole 24 can preferably be formed.

Figure 1D:
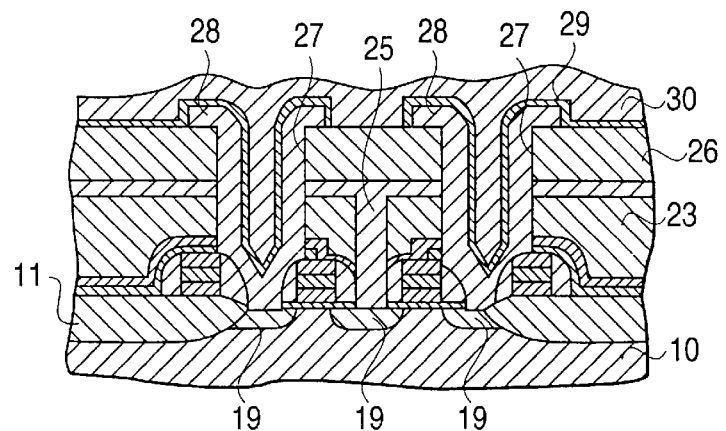

After forming the contact hole 24, a bit line 25 is formed so as to contact the diffused region 19 via the contact hole 24. After then, as shown in FIG. 1D, a third interlayer insulator 26 is formed on the bit line 25. The interlayer insulator 26 is formed in a similar manner as the second borophosphosilicate glass film 23.

After forming the interlayer insulator 26, for forming a memory capacitor, a cell contact 27 is formed in the interlayer insulator 26, the first and second borophosphosilicate glass films 22, 23, and the sacrificial film 21, using first and second dry etching.

Next, a storage electrode 28 which is made up of a doped-polysilicon is formed in the cell contact 27. A dielectric film 29 is formed on the storage electrode 28. A cell plate 30 is formed on the dielectric film 29. As a result, the memory capacitor is made up of the storage electrode 28, the dielectric film 29, and the cell plate 30.

In the dry etching, since the first borophosphosilicate glass film 22 has a concentration of boron oxide which is lower than the second borophosphosilicate glass film 23, the first borophosphosilicate glass film 22 has an etch rate which is higher than the second borophosphosilicate glass film 23. Therefore, before erosion of a shoulder portion 21b of the sacrificial film 21 in the first dry etching, a bottom portion 21a of the sacrificial film 21 can be exposed. Accordingly, a damage of the sidewall spacer 18 in the second dry etching caused by the erosion of the shoulder portion 21b of the sacrificial film 21, can be avoided. It can thus be avoided that the gate 14 shorts with the storage electrode 28. Further the first preferred embodiment provides an underlayer having an outdiffusion preventing function for phosphorus of plural interlayer insulators that include boron.

Figure 2:
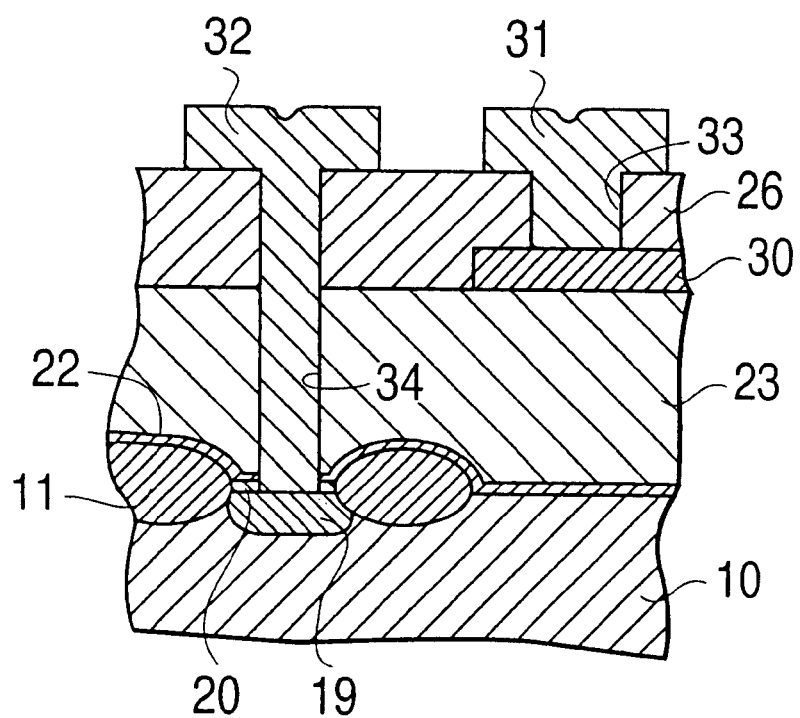
FIG. 2 is a sectional view showing a method for forming a semiconductor device according to a second preferred embodiment of a present invention.

FIG. 2 is a sectional view showing a semiconductor device according to a second preferred embodiment of a present invention.

As shown in FIG. 2, a field oxide film 11 is formed so as to surround a diffused region 19 on a semiconductor substrate 10. An oxide film 20 is formed on the diffused region 19. The oxide film 20 is covered with a first borophosphosilicate glass film 22. A second borophosphosilicate glass film 23 is formed on the first borophosphosilicate glass film 22. A cell plate 30 is formed on the second borophosphosilicate glass film 23. An interlayer insulator 26, preferably to a thickness of 4000–8000 Å, covers the cell plate 30. In a first contact hole 33 to the cell plate 30 via the interlayer insulator 26 a cell plate contact 31 is formed. In a second contact hole 34 to the diffused region 19 via the interlayer insulator 26, the first and second borophosphosilicate glass films 22, 23, and the oxide film 20, a diffused region contact 32 is formed. The first contact hole 33 has a different depth than the second contact hole 34. The first borophosphosilicate glass film 22 has an etch rate which is faster than that of the second borophosphosilicate glass film 23. Accordingly, the first and second contact holes having a different depth can form, simultaneously, without damaging the cell plate.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A method of forming a semiconductor device comprising:

provided a semiconductor substrate having an active region;

covering the active region of the semiconductor substrate with an oxide film;

covering the oxide film with a first borophosphosilicate glass film; and forming a second borophosphosilicate glass film directly on the first borophosphosilicate glass film so as to be in contact with the first borophosphosilicate glass film, the second borophosphosilicate glass film having a concentration of boron oxide which is higher than a concentration of boron oxide in the first borophosphosilicate glass film, and the second borophosphosilicate glass film having a concentration of phosphorus which is substantially the same as a concentration of phosphorus in the first borophosphosilicate glass film, to prevent out diffusion of dopants from the second borophosphosilicate glass film to the semiconductor substrate via the oxide film.

2. The method of forming a semiconductor device as claimed in claim 1, wherein the concentration of boron oxide in the first borophosphosilicate glass film is 10–12 weight % and the concentration of boron oxide in the second borophosphosilicate glass film is 12–18 weight %.

3. The method of forming a semiconductor device as claimed in claim 1, wherein the oxide film has a thickness in a range of 200–500 Å.

4. The method of forming a semiconductor device as claimed in claim 3, wherein the first borophosphosilicate glass film has a thickness in a range of 1,000–2,000 Å and the second borophosphosilicate glass film has a thickness in a range of 3,000–5,000 Å.

5. The method of forming a semiconductor device as claimed in claim 1, wherein the dopants comprise phosphorus.

6. A method of forming a semiconductor device comprising:

providing a semiconductor substrate having an active region;

covering the active region of the semiconductor substrate with an oxide film, the oxide film having a thickness in a range of 200–500 Å;

covering the oxide film with a first borophosphosilicate glass film, the first borophosphosilicate glass film having a thickness in a range of 1,000–2,000 Å; and forming a second borophosphosilicate glass film directly on the first borophosphosilicate glass film so as to be in contact with the first borophosphosilicate glass film, the second borophosphosilicate glass film having a thickness in a range of 3,000 to 5,000 Å, the second borophosphosilicate glass film having a concentration of boron oxide which is higher than a concentration of boron oxide in the first borophosphosilicate glass film, and the second borophosphosilicate glass film having a concentration of phosphorus which is substantially the same as a concentration of phosphorus in the first borophosphosilicate glass film.

7. The method of forming a semiconductor device as claimed in claim 6, wherein the concentration of boron oxide in the first borophosphosilicate glass film is 10–12 weight % and the concentration of boron oxide in the second borophosphosilicate glass film is 12–18 weight %.

8. The method of forming a semiconductor device as claimed in claim 6, wherein the concentration of boron oxide in the second borophosphosilicate glass film prevents dopants from diffusing from the first borophosphosilicate glass film to the semiconductor substrate via the oxide film, the dopants comprising phosphorus.

* * * * *